(12) United States Patent
Bauer et al.

(10) Patent No.: US 7,544,540 B2
(45) Date of Patent: Jun. 9, 2009

(54) ENCAPSULATED ELECTRICAL COMPONENT AND PRODUCTION METHOD

(75) Inventors: Christian Bauer, Munich (DE); Hans Krueger, Munich (DE); Alois Stelzl, Munich (DE)

(73) Assignee: EPCOS AG, Munich (DE)

( * ) Notice: Subject to any disclaimer, the term of this patent is extended or adjusted under 35 U.S.C. 154(b) by 21 days.

(21) Appl. No.: 11/578,854

(22) PCT Filed: Apr. 21, 2005

(86) PCT No.: PCT/EP2005/004309

§ 371 (c)(1),
(2), (4) Date: Jun. 1, 2007

(87) PCT Pub. No.: WO2005/102910

PCT Pub. Date: Nov. 3, 2005

(65) Prior Publication Data

US 2007/0222056 A1  Sep. 27, 2007

(30) Foreign Application Priority Data

Apr. 22, 2004  (DE) .................. 10 2004 020 204

(51) Int. Cl.
*H01L 21/44* (2006.01)
(52) U.S. Cl. .............. 438/108; 438/121; 438/124
(58) Field of Classification Search ............ 438/50, 438/52, 108, 121, 124; 257/704, 710, 678, 257/737, 738, 777–796, E23.127
See application file for complete search history.

(56) References Cited

U.S. PATENT DOCUMENTS 3,587,322 A  6/1971  Lobdell et al.
4,424,419 A  1/1984  Chaput et al.
4,454,440 A  6/1984  Cullen
4,545,440 A  10/1985  Treadway
4,866,683 A  9/1989  Phillips
5,091,051 A  2/1992  Greer
5,184,107 A  2/1993  Maurer
5,216,490 A  6/1993  Greiff et al.
5,650,685 A  7/1997  Kosinski et al.

(Continued)

FOREIGN PATENT DOCUMENTS

DE  198 06 818  11/1999

(Continued)

OTHER PUBLICATIONS

English translation of Written Opinion for PCT/EP2005/004309.

(Continued)

*Primary Examiner*—Evan Pert
*Assistant Examiner*—Selim Ahmed
(74) *Attorney, Agent, or Firm*—Fish & Richardson P.C.

(57) ABSTRACT

A micro-electro-mechanical systems (MEMS) component includes a panel, a chip having an underside containing active component structures, where the chip is mounted on the panel via bumps, a frame structure on the panel and enclosing an installation site of the chip, and a jet-printed structure closing a seam between frame structure and chip. The jet-printed structure has an upper edge that is above a lower edge of the chip.

18 Claims, 4 Drawing Sheets

U.S. PATENT DOCUMENTS

| | | | |
|---|---|---|---|
| 5,739,585 A | 4/1998 | Akram et al. | |
| 5,990,418 A | 11/1999 | Bivona et al. | |
| 6,150,753 A | 11/2000 | DeCastro | |
| 6,178,249 B1 | 1/2001 | Hietanen et al. | |
| 6,187,249 B1 | 2/2001 | Lewellin | |
| 6,324,907 B1 | 12/2001 | Halteren et al. | |
| 6,400,065 B1 | 6/2002 | Toda et al. | |
| 6,433,412 B2 | 8/2002 | Ando et al. | |
| 6,492,194 B1 * | 12/2002 | Bureau et al. | 438/106 |
| 6,530,515 B1 | 3/2003 | Glenn et al. | |
| 6,613,605 B2 | 9/2003 | Pace | |
| 6,614,911 B1 | 9/2003 | Watson et al. | |
| 6,649,446 B1 | 11/2003 | Goetz et al. | |
| 6,722,030 B1 | 4/2004 | Stelzl et al. | |
| 6,732,588 B1 | 5/2004 | Mullenborn et al. | |
| 6,781,231 B2 | 8/2004 | Minerevini | |
| 6,800,987 B2 | 10/2004 | Toda | |
| 6,809,413 B1 | 10/2004 | Peterson et al. | |
| 6,829,131 B1 | 12/2004 | Loeb et al. | |
| 6,904,155 B2 | 6/2005 | Yonehara et al. | |
| 6,924,429 B2 | 8/2005 | Kasai et al. | |
| 6,924,974 B2 | 8/2005 | Stark | |
| 6,930,364 B2 | 8/2005 | Bruner | |
| 7,053,456 B2 | 5/2006 | Matsuo | |
| 7,072,482 B2 | 7/2006 | Van Doorn et al. | |
| 7,092,539 B2 | 8/2006 | Sheplak et al. | |
| 7,146,016 B2 | 12/2006 | Pedersen | |
| 7,166,910 B2 | 1/2007 | Minervini | |
| 7,242,089 B2 | 7/2007 | Minervini | |
| 7,259,041 B2 * | 8/2007 | Stelzl et al. | 438/106 |
| 7,388,281 B2 * | 6/2008 | Krueger et al. | 257/678 |
| 2002/0076910 A1 | 6/2002 | Pace | |
| 2002/0110256 A1 | 8/2002 | Watson et al. | |
| 2003/0034536 A1 | 2/2003 | Scheeper et al. | |
| 2003/0035558 A1 | 2/2003 | Kawamura et al. | |
| 2003/0124829 A1 | 7/2003 | Pace | |
| 2003/0133588 A1 | 7/2003 | Pedersen | |
| 2004/0046245 A1 | 3/2004 | Minervini | |
| 2004/0161530 A1 | 8/2004 | Stark | |
| 2005/0018864 A1 | 1/2005 | Minervini | |
| 2005/0185812 A1 | 8/2005 | Minervini | |
| 2005/0218488 A1 | 10/2005 | Matsuo | |
| 2006/0157841 A1 | 7/2006 | Minervini | |
| 2007/0082421 A1 | 4/2007 | Minervini | |
| 2007/0099327 A1 | 5/2007 | Hartzell et al. | |
| 2007/0201715 A1 | 8/2007 | Minervini | |
| 2007/0202627 A1 | 8/2007 | Minervini | |

FOREIGN PATENT DOCUMENTS

| | | |
|---|---|---|
| DE | 103 03 263 | 8/2004 |
| DE | 202005001559 | 6/2005 |
| DE | 10 2005 008 512 | 8/2006 |
| EP | 0 742 643 | 2/2002 |
| FR | 2 799 883 | 4/2001 |
| JP | 07-212180 | 8/1995 |
| JP | 07-212181 | 8/1995 |
| JP | 10-321666 | 12/1998 |
| WO | WO99/43084 | 8/1999 |
| WO | WO99/56390 | 11/1999 |
| WO | WO00/70630 | 11/2000 |
| WO | WO01/26136 | 4/2001 |
| WO | WO02/15636 | 2/2002 |
| WO | WO02/17364 | 2/2002 |
| WO | WO2004/019490 | 3/2004 |
| WO | WO2005/086532 | 9/2005 |
| WO | WO2007/022249 | 2/2007 |

OTHER PUBLICATIONS

Hayes D J et al: "Printing systems for MEMS packaging" vol. 4558, 2001, pp. 206-214 XP 002342860.

M.Oda et al: New Nanostructured Film Making Method Using Ultra Fine Particles; pp. 21-26.

Hayes D J et al: "Micro-jet printing of polymers for electronics manufacturing" 1998 IEEE; pp. 168-173, XP 002342861.

International Search Report for PCT/EP2005/004309.

Written Opinion for PCT/EP2005/004309.

International Search Report and Written Opinion in Application No. PCT/EP05/004309, dated Sep. 13, 2005.

International Preliminary Report on Patentablility in Application No. PCT/DE2006/001736, dated Apr. 29, 2008.

International Search Report and Written Opinion in Application No. PCT/DE2006/001736, dated Mar. 12, 2007.

International Search Report and Written Opinion in Application No. PCT/DE2006/001946, dated Feb. 22, 2007.

International Preliminary Report on Patentablility in Application No. PCT/DE2006/001946, dated Jun. 11, 2008.

International Search Report and Written Opinion in Application No. PCT/DE2006/001945, dated Mar. 28, 2007.

International Preliminary Report on Patentability in Application No. PCT/DE2006/001945, dated Jun. 11, 2008.

International Search Report and Written Opinion in Application No. PCT/EP03/06596, dated Jan. 20, 2004.

Barton et al., "Optimisation of the Coating of a Fiber Optical Sensor Embedded in a Corss-ply GFRP Laminate" Composites: Part A 33 (2002) pp. 27-34.

Bergqvist et al., "A Silicon Condenser Microphone Using Bond and Etch-Back Technology", Sensors and Actuators A, vol. 45, pp. 115-124 (1994).

Selmeier et al., "Recent Advances in Saw Packaging", IEEE Ultrasonics Symposium; 2001; pp. 283-292.

Torkkeli et al., "Capacitive Silicon Microphone", Physica Scripta., vol. T79, pp. 275-278 (1999).

* cited by examiner

ENCAPSULATED ELECTRICAL COMPONENT AND PRODUCTION METHOD

TECHNICAL FIELD

This application describes an encapsulated component, such as a MEMS (microelectro mechanical system) component, a MEOPS (micro electrooptical system) component, or a MEOMS (microelectro optomechanical system) component. The component comprises a chip containing essential component functions and is mounted in a flip chip construction.

Such a chip is typically constructed of a substrate, which is, for instance, a piezoelectric substrate for a component operating with acoustic waves. The chip surface facing the panel, referred to below as the underside, carries active component structures, such as resonators operating with acoustic surface waves or volume waves or electroacoustic converters for surface waves.

BACKGROUND

Various methods have been proposed for encapsulation of components in order to provide sensitive conductive component structures on the chip with protection from environmental effects, as well as mechanical protection.

For example, there is the possibility of sealing off a space between the chip periphery and the panel with an underfiller and sputtering a metal layer on the component. This method has the disadvantage that conductive structures (particularly acoustic converters) on the chip must be protected from the underfiller with, for example, a plastic cap. Expensive process steps are required for this.

It was proposed in DE 198 06 818 A that the chips be soldered in a flip chip arrangement on a panel and subsequently covered with a film such as a laminate film that tightly seals to the substrate between the chips. In additional variations of such film coverings of components, it is also proposed that these films be further hermetically sealed off by applying a metal layer over the film and reinforcing this metallization galvanically.

SUMMARY

A MEMS component is described that is implemented on a chip carrying active component structures on its underside. The chip is mounted by its underside on a panel via bumps. The installation site of the chip on the panel is tightly enclosed by a frame structure. A jet print structure that closes off a seam between frame structure and chip is placed on the frame structure and the chip.

The inventors found that a structure forming material can be applied to a surface very precisely with a jet printing process, and can be used to form structures and to seal off a seam. The jet printed structure may include a polymer that is applied in the liquid in an uncured or melted state with a jet printing process. The high structural precision that is obtainable with a jet printing process makes it possible to produce jet printed structures up to a height of more than 1000 μm at a width of less than 100 μm and also to structure the jet printed structure three dimensionally. A specified edge profile or a 3D structuring can be achieved if the jet printed structure is applied in several differently structured layers.

In this manner, one can close off a wide seam completely with the aid of a jet printed structure, so that an element is obtained that is encapsulated on all sides and hermetically sealed. The structural precision also results in a structure that requires less space as compared to differently applied structures.

The jet printed structure may be created from a polymer that is deposited in the form of fine droplets on the substrate and forms a three dimensional structure there. At a selected droplet size of, for instance, 30 to 70 μm, jet printed structures of roughly 20 to 30 μm height can be created in one pass. For droplet sizes of 30 to 70 μm, the jet printed structures can have a width of only about 50-100 μm. It is also possible to apply the jet printed structure in several layers. In this case, more than 1000 μm height can be achieved with the same structural width.

The polymer used for the jet printing process is preferably a UV curing reaction resin that can quickly begin to cure after exiting the print head or after deposition, so that the deposited structure runs only slightly and therefore even a single layer structure can achieve a relatively high aspect ratio of 0.3 to 0.5. The aspect ratio can even reach 10 or more with a multilayer jet printed structure.

Other types of polymers that quickly harden or solidify upon striking the panel or the frame structure, such as heat curing two component resins or thermoplastics melted before deposition, are also suitable for producing the jet printed structure.

This polymer can also contain inorganic or organic pigments and doping materials in order to obtain certain properties in the jet printed structure. In that way, the structure can, for instance, be adapted with respect to its coefficient of thermal expansion (CTE), be sensitized to laser radiation, or be activated for currentless metal deposition. The polymer can also contain water absorbing particles that can absorb water enclosed inside the empty space in the component and not release it at temperatures appearing when the component is solder mounted or operated.

The material applied in the jet printing process can also contain nanoparticles that can yield compact and conductive coatings with thermal or UV processing after application to inorganic or organic surfaces.

Structure and layer production methods with nanoparticles are known, such as spin on methods with nanoparticle containing dispersions, and dry gas jet coatings via a nozzle. These materials can now also be applied with jet printing.

With the jet printing process, nanoparticle containing dispersions in solvents or liquid polymers can be used to produce jet printed structures. Nanoparticles can be manufactured from a number of different materials such as metal, ceramic or organic materials. They may have a size of 5 to 100 nm. Dispersions containing ceramic and metallic nanoparticles are particularly suitable for jet printed structures. Dispersions produced from deposited or printed dispersions can be transformed into a desired form with thermal or photochemical post treatments. In some cases they can also yield the desired structure directly, optionally after removal of the solvent by, for instance, evaporation. Thus it is also possible to produce metallic or only metallically conductive jet printed structures, or to produce such coatings on already existing structures. Ceramic layers and structures can also be produced this way. It can be necessary for this purpose to transform a primary jet printed structure that still contains a polymer as well as inorganic particles after application of the jet printing into a purely inorganic jet printed structure by vaporization, decomposition or baking of the polymer.

The polymer can also be thermoplastic, so that it can be melted before the deposition and re-solidifies after deposition.

The substance to be applied can also be a reaction resin, optionally comprising two components, which is sprayed with or without solvent onto the appropriately heated panel and which thereafter quickly cures.

The jet printed structure is advantageously placed on a surface with a modified surface energy and which has been adjusted not to be wettable relative to the jet printed structure and to be hydrophobic. On a surface that is not wettable with the jet printed structure, no running of the jet printed structure in the liquid state takes place shortly after application. Therefore, a jet printed structure applied to a modified surface also has defined edge angles. It is thus possible to apply the jet printed structure with particular structural precision, without running. It is also possible, however, to adjust the surface energy to a desired value that corresponds to a desired angle of wetting of the still-fluid jet printed structure after application. The exact edge angle to be sought is dependent on the desired three dimensional profile of the jet printed structure A surface with modified surface energy can have a doping or a thin monomolecular to multimolecular layer that is not wettable by the jet printing medium. A modified surface energy can also be obtained by doping the surface with surface active substances, in which case an elevated affinity of the surface for the jet printed structure is obtained at desired places. The material used for the jet printed structure can also be selected or adjusted such that, with regard to its surface energy, it is matched to the surface energy of the surface to be printed.

Those modifications in which substances are chemically bonded to the treated surface and compressed there into a monomolecular layer are advantageous.

The frame structure that encloses the installation site of the chip can have a height above the panel such that its upper edge is at a higher level than the lower edge of the chip. Thus, the seam between frame structure and chip runs substantially vertically. Such a vertical seam can be well sealed with the jet printed structure in conjunction with a surface modification.

The frame structure can be formed from a metal or can comprise a metallic coating. It is advantageous in this case that a metallic frame structure seals particularly well and tightly to the panel, particularly a ceramic one. Then it is possible, on to the jet printed structure that lies substantially in the area of the seam, to provide an additional cover layer that seals to the frame structure and therefore makes a good and hermetically tight bond to the frame structure possible. The cover layer can lie directly on the upper side of the chip and be in good thermal contact with the chip there. This has the advantage that waste heat can be removed particularly well from the chip.

A metallic covering can also shield the chip against electromagnetic radiation. It is further possible to ground the metallic covering and thus protect the chip against electrostatic and other interfering electrical influences from outside. It can be further advantageous if, on the back side, the chip has a terminal that is in contact with the metallic covering. This can be the ground contact of the chip.

Under the covering, it is also possible to apply an additional jet printed structure over the entire surface on the back of the chip. It is further possible to widen the jet printed structure itself into a cover layer that covers the chip on the back. The cover layer, however, can also be a film that is laminated onto the back side of the chip and that tightly seals to the frame structure or the panel surface surrounding the chip. Such a laminate film can be a pure plastic film. It can also be multi-layered and can comprise a metallic layer. The covering can also be a globtop covering that can be produced by a liquid polymer in droplets up to a desired layer thickness.

The jet printed structure can cover only parts of the backside of the chip. It is possible to keep the lateral edges of the chip free from the jet printed structure, at least in part, so that the latter can come directly in contact with a cover layer produced elsewhere.

The frame structure can have a step declining towards the chip. This step can serve to apply the jet printed structure exclusively to the lower step and thus to further define and delimit with regard to its dimensions. The lower step of the frame structure can also lie at a level beneath the lower edge of the chip. Then it is also possible for this lower edge to lie partly below the chip so that the interior space delimited by the lower step is smaller inside the frame structure than the surface that the chip occupies.

In another embodiment, the chip is seated on the lower step. If the frame structure, and the lower step in particular, has a sufficiently flat surface, then the chip can make good contact all around its edge region with the frame structure and especially on the lower step of the frame structure. First, an exact spacing between the panel and the underside of the chip is guaranteed with this construction. Second, the frame structure offers a mechanically secure, strain free and well-defined mounting for the chip. It is also possible thereby to sheathe the element by molding (injection molding). This is particularly possible if a jet printed structure is used for which the glass transition temperature lies above the temperature required for molding.

Outside the surface enclosed by the frame structure, which corresponds to the installation site for the chip, it is possible to arrange a polymer strip such that the surface of the panel is exposed between the polymer strip and the frame structure. The polymer strip can surround the frame structure annularly. It is possible in this way to create a cover layer that tightly seals the entire frame structure to the panel inside the surface between the polymer strip and the frame structure.

To manufacture the above described MEMS component, it is possible to start from a large surface panel that provides a number of chip installation sites with corresponding contacts for connection to chips. In a first step, a number of frame structures corresponding to the number of chip installation sites are created on the panel, tightly enclosing each chip installation site. A corresponding number of chips that carry active component structures on their underside is subsequently connected via a suitable connecting technique to the panel in these installation sites. This can be done by way of bumps or by a thin solder layer in the case of chips lying on top of the frame structure.

If the chip is mechanically and electrically connected to the panel in this manner, the remaining seam between the frame structure and the chip is closed off by printing a jet printed structure onto it with the aid of a jet printing process. As already described, a low viscosity uncured polymer, a melted thermoplastic, a dispersion containing polymer particles, or a dispersion containing solid nanoparticles is applied with a precise structure and in a defined manner to the desired place via a jet printing nozzle. In the jet printing process, a sufficiently low viscosity drop is sprayed out via a suitable nozzle. This can be initiated inside a cannula system carrying a polymer or a dispersion by an abruptly rising pressure that can be generated, for instance, by a piezo system or a rapid temperature increase.

The desired structural precision in the jet printing process is influenced by several parameters. The diameter of the polymer or dispersion droplets ejected via the jet printing process onto the surface determines the lower boundary of the structural widths that can be produced. A certain running is unavoidable merely from the impact pressure. With a drop size of 70 µm, for instance, 100 µm wide structures can be produced in this way. How much a droplet deposited by the jet printing process runs thereafter is dependent on the surface energy of the base, and can accordingly be adjusted by modifying the surface energy of the base. If the latter is not wetting relative to the deposited material or the deposited dispersion, then a steep edge angle of, for instance, 90° and more is formed, since the surface tension of the droplet is then greater than the surface tension of the underlying surface. Thus, the deposited drops can even draw back together and occupy an even smaller surface. A non-wetting surface is an advantage particularly in the area of the seam and for closing off the latter. There a capillary adhesion of the deposited material in the seam, which can constitute a slit, is avoided. In this case, it is advantageous to adjust a slight wetting in order to obtain sufficient adhesion of the printed material on the surface. The point is only to avoid spreading of the deposited droplet.

The edge angle of the deposited material here must be greater than 90° on the surface so that a capillary depression takes place. But even without a surface modification, the seam between the frame structure and the chip can be closed off with sufficient security with the jet printing process and a sufficiently viscous material, without polymer material flowing further into the seam and possibly covering up component structures on the underside and thus interfering with or damaging the chip functions.

The energy of the surface on which the jet printed structure is placed can be modified by a plasma treatment, such as a plasma that contains fluorine. A thin layer containing fluorine and having a low surface energy can be deposited via this plasma treatment.

It is also possible, however, to attain the modification of the surface by treatment with a modifying solution. It is also possible, for instance, to silanize the surface with an organosilicon solution. The corresponding silanized or siloxized surfaces likewise have a low surface energy. The layer thicknesses of a layer applied for reducing the surface energy can lie in the range of a few molecular thicknesses, even a monomolecular layer being sufficient to reduce the surface energy.

The surface energy can also be modified by doping the printing material with surface active substances such as adhesion promoters that act selectively. Surface treatment can generally be done by treatment with an aqueous phase or by treatment with a gas phase, such as by layer deposition from the gas phase or an aqueous phase.

The surface energy can be adjusted for metallic surfaces as well. In this case, one can consider, alongside polymeric and inorganic insulating coatings, modification of the metallic surface by other metallic coatings, or also an oxidation of the material, or a modification by deliberate whisker formation.

The surface energy can be modified particularly successfully on metallic surfaces. The process can be achieved in conjunction with a metallic or a metallic frame structure.

The polymer applied by the jet printing process either cures directly or can be cured in a subsequent step. It is advantageous to carry out the curing by means of UV or at least a preliminary curing initiated by UV and further curing thermally. This has the advantage that thermal curing, which inevitably leads to a softening of the jet printed structure by reduction of the viscosity, is avoided, or that the running of the jet printed structure in thermal curing is prevented.

It is also possible to perform the jet printing process at elevated temperature and with a hot nozzle. Thereby, the viscosity of the printing material can be reduced. The material can solidify during printing, or at least obtain strength immediately. Even a melted thermoplastic that requires no further treatment after cooling and solidifying can be printed in this manner. It is also possible to deposit melted metal by means of jet printing and thus produce a structured metallization directly.

It is also possible to print a dispersion comprising solid particles in a solvent or a polymer, which dispersion conserves its printed structure due to curing or rapid removal of the mobile phase. After removal of the mobile phase, there can nonetheless be a post treatment in order to compact the structure or change its properties. The solid particles in the dispersion can be inorganic, such as ceramic or metallic. It is also possible, however, to apply a dispersion of polymer particles. A dispersion can have both organic and inorganic constituents.

After application and, if appropriate, curing of the jet printed structure, a cover layer can be produced by, for instance, application and curing of a plastic layer in liquid phase, by application of a film or by metallization of the arrangement.

To produce a metallic cover layer, a relatively thin base metallization can first be applied over the entire surface by sputtering, CVD, PECVD, by vapor deposition or by some other thin film process. This base metallization can subsequently be reinforced by deposition of a metal layer from solution. This can be done galvanically or by a currentless method. The cover layer can also be applied by a jet printing process, in which case a different nozzle thickness is selected and a material differing from the previous jet printed structure can be applied.

In order to produce the cover layer, a jet printing process may also be used only in part. It is possible, for instance, to produce a cast frame enclosing the later covering directly on the panel, and then to apply and subsequently cure a more liquid polymer inside the cast frame. Since the cast frame prevents running of the polymer, the curing of the polymer applied inside the cast frame can also be done thermally.

After production of the covering, there can also be a separation into individual components or into modules containing several chips by subdivision of the panel, for instance, by sawing.

Since the chip and the panel normally include different materials, strains between chip and panel can occur in case of changes of temperature. These strains act particularly on the soldering points and on the seam that has been closed off with the jet printed structure, which can also be a relatively large gap. It is therefore advantageous to optimize the frame structure, the material for closing off the seam and the height of the seam such that a desired thermal behavior is obtained, which is particularly adapted to the expansion behavior of the bumps and of the other chip/panel connections. It is advantageous, however, to produce the metal frame at least up to a height that matches the bumps. The frame structure can also be produced on the panel with ceramic, however.

DETAILED DESCRIPTION

Figure 1:
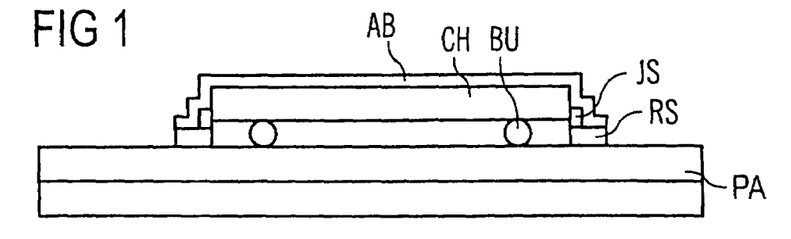
FIG. 1 shows a first MEMS component with jet printed structure and covering.

FIG. 1 shows a first embodiment in schematic cross section. The component is arranged on a panel PA, which may be a ceramic panel that is constructed of at least one layer of ceramic material. It is also possible, as shown by two layers in the figure, to construct the panel of multiple layers, in which case it is possible to interpose metallization layers—structured for the production of circuit elements selected from resistors, inductors, metallization surfaces and capacitors—between two ceramic layers. Additional metallization planes are located on the upper surface and the underside of panel PA.

Different metallization planes are then electrically connected to one another by through contacts. Solderable terminal pads for contacting a chip CH are provided on the upper surface of the panel. Solderable contacts for connecting the finished component to a circuitry environment are provided on the underside.

The component functions of the MEMS component are realized substantially on the chip CH, which carries active component structures, such as metallizations, on the underside facing the substrate. The chip is electrically and mechanically connected via connecting structures, represented in the figure by bumps BU, to the panel, or to terminal pads placed there. The bumps may be solder bumps or stud bumps that include gold.

Additionally, a frame structure RS that is elevated relative to the level of the panel otherwise is provided on panel PA. The frame structure is closed annularly such that at least the active component structures of chip CH and the solderable connector surfaces are arranged inside the frame structure. The seam between chip CH and frame structure RS is closed off by a jet printed structure JS. Just like the frame structure, it is arranged circumferentially around the chip edge, and completely seals off the hollow space between the chip surface and the panel's upper surface that is created in order to accommodate the active component structures. Another optional and not mandatory covering AB that includes a sealing material of appropriate layer thickness is shown here.

The frame structure may be prefabricated before the mounting of the chip on the panel. It can be manufactured of different materials and can also comprise a multilayer structure of different materials. It is possible, for instance, for the frame structure to comprise a ceramic material. This can then be applied by screen printing before sintering of the panel. Such a frame structure is easily produced technologically.

It is also possible, however, to apply the frame structure after the sintering of the panel. It can include plastic that is printed, applied by jet printing, or structured by phototechnology from a large surface polymer layer.

It is also possible to manufacture frame structure RS from a metallic material. For this purpose, frame structure RS may be deposited in structured form, currentlessly or galvanically on the surface of the panel in the desired height. It is also possible to manufacture the frame structure from several layers of different materials, the upper layers being produced with the highest relative structural precision. Thus it is possible, for instance, to produce a lower sublayer of the frame structure with a process that permits a high tolerance and, only in the upper layer area, to structure the frame structure highly precisely with a process having a low tolerance and to position it more precisely relative to the chip.

Figure 2:
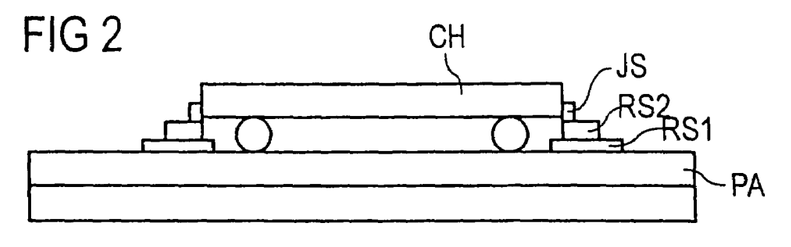
FIG. 2 shows a MEMS element with a modified frame structure.

FIG. 2 shows such a component with a frame structure that includes sub layers structured with differing precision. A lower sub layer RS1 of the frame structure can include ceramic, for instance, while the upper sublayer RS2 of the frame structure can include plastic such as a jet printed structure, or of metal such as a galvanically applied frame structure RS2.

Figure 3:
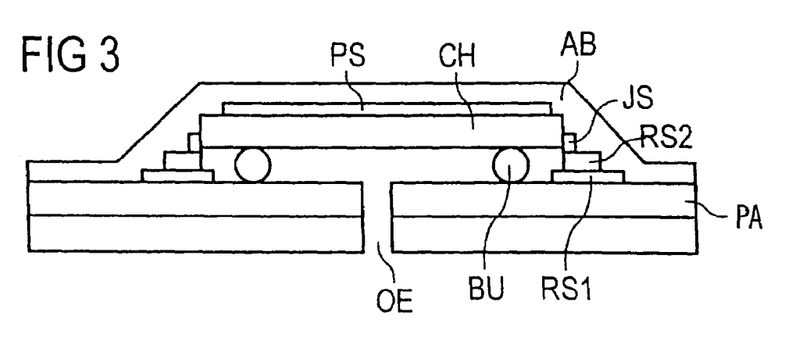
FIG. 3 shows a component with covering.

In schematic cross section, FIG. 3 shows a component that includes a covering and has additional configurations. Thus, on the back side of the chip, underneath covering AB, there is a polymer layer PS that is formed as a damping coating for components such as SAW components or FBAR components that operate with acoustic waves and is optimized in its thickness and acoustic impedance. In this manner, nonsuppressed volume acoustic waves, which may be generated by the active component structures on the underside of the chip, run to the upper side of the chip and can be successfully absorbed and attenuated there. The polymer layer PS, however, can also serve, particularly in case the component is later covered with a covering comprising a metallic layer, to reduce capacitive interactions of the component structures with the metallic covering. The covering is again shown only schematically and can comprise the different materials already mentioned.

In an additional configuration, an opening OE extending into a cavity underneath the chip is provided in the panel, as shown in FIG. 3. This opening can be used to remove gaseous contaminants arising during manufacturing of the component, such as moisture or outgassing from the materials that are used, to perform protective gas filling if desired, or to evacuate the cavity. Finally opening OE is closed, for instance with solder or a plastic material.

Figure 4:
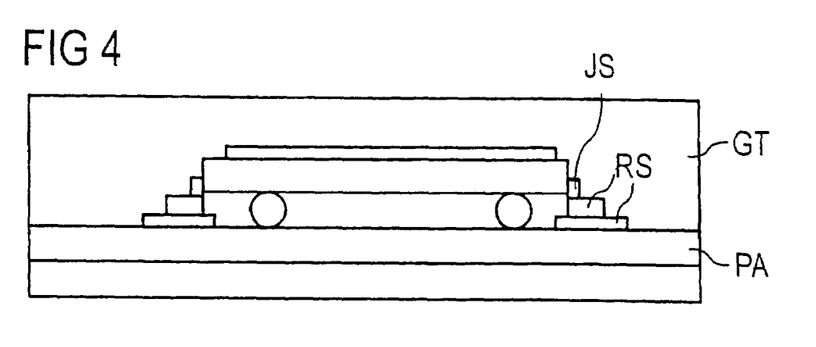
FIG. 4 shows a component with globtop covering or molded covering.

FIG. 4 shows, in a schematic cross section, an additional component in which a globtop covering or an injection molded sheath GT is used as a covering above the chip and the surface of the panel. This is obtained by applying droplets of a liquid polymer or one that is of low viscosity during application. It is also possible, however, to furnish the component with an injection molded sheath by injection molding from plastic. With such a globtop covering or injection molded sheath, a hermetic enclosure of the active component structures is obtained and the component is also mechanically protected against external effects. The covering can also serve for electrical insulation.

Figure 5:
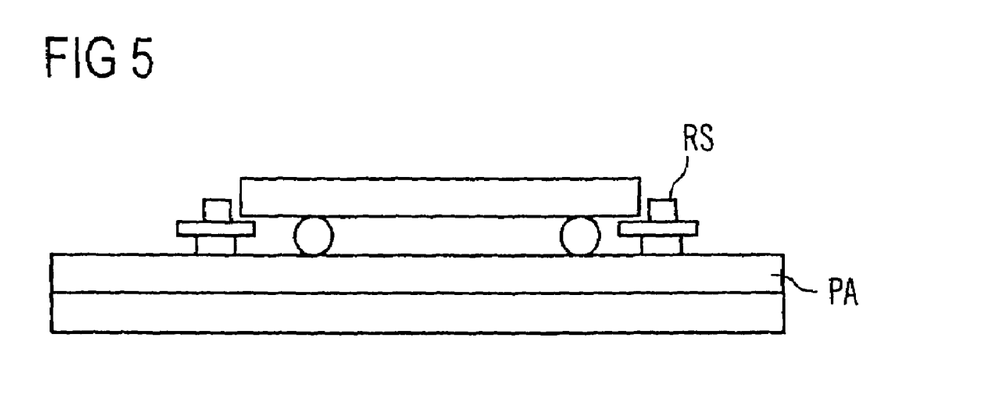
FIGS. 5-7 show differently formed frame structures.

In schematic cross section, FIG. 5 shows a MEMS component with varied frame structure RS, after placement of chip CH on panel PA. Frame structure RS is a step that declines towards the edge of the chip. The surface of the lower step extends under the chip, so that the latter is slightly above the step, or can rest on the lower step after mounting via bumps, for example. A defined spacing of the underside of the chip away from the panel surface is guaranteed by this frame structure that is inserted under the chip's edge. Moreover, the seam between frame structure and chip is essentially a vertical slit that angles under the chip in the lower area. A subsequently applied jet printed structure is additionally prevented in this manner from reaching into the cavity underneath the chip and possibly coming into contact there with active component structures. The component obtained in this way is now already moldable and can thus be furnished with an injection molded sheath for further encapsulation.

Also shown in the figure is a third sub layer of the frame structure directly on the panel and having a smaller cross section here than the step extending under the chip. It is also possible, however, for this lower sub layer to further broaden the frame structure downwards. A frame structure RS as shown can be implemented, for instance, by a three layer metallic frame structure of copper/nickel/copper, in which the step(s) was (were) produced by a differing selectivity with respect to an etching process.

Figure 6:
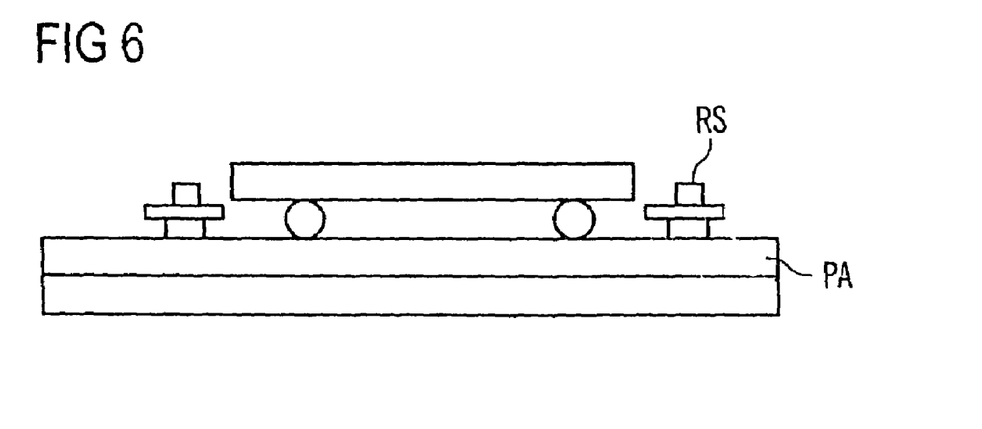

FIG. 6 shows a similar frame structure, in which the step of the frame structure that declines towards the chip does not extend under the chip's edge.

Figure 7:
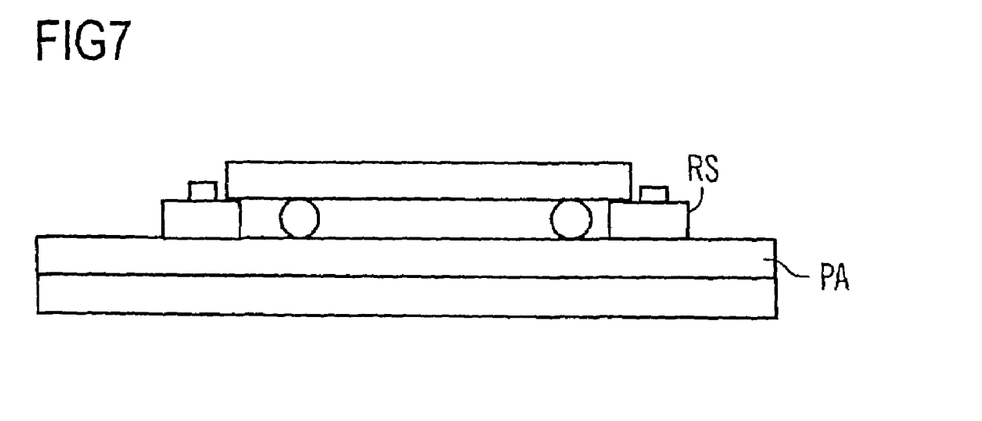

FIG. 7 shows a further varied frame structure RS that likewise has a two step structure declining towards the chip. The chip's edge lies on the lower step. The seam or the interstice between the frame structure and the lateral edge of the chip can be closed here in a simple manner with a jet printed structure. It is generally the case that, the smaller the seam between frame structure RS and chip CH is, the smaller is the volume of the required jet printed structure. A small volume for the jet printed structure has the advantage of a savings of material that also results in a smaller amount of solvents or moisture contained in the jet printed structure. Since most polymers also absorb moisture over time, the water absorption ability of the overall component is also reduced with the low volume. For this embodiment as well, it is true that the distance between the panel surface and the underside of the chip with the active component structures is defined.

If as an additional aspect, one takes the coefficients of thermal expansion of the frame structure into consideration in the construction of the frame structure, and adapts them to the coefficients of thermal expansion of the bumps, then a low stress soldered component is obtained, particularly with a chip on the frame structure. The strains that appear in case of alternating thermal stresses are reduced. An adaptation of the coefficients of thermal expansion of the frame structure at a given height is successful by virtue of the above mentioned multilayer structure with an appropriate variation of the layer thicknesses and materials. If the frame structure has a given spacing away from the chip and, in particular, the chip's lower edge, then the jet printed structure introduced there in the seam enters into the calculations of the coefficients of thermal expansion of the entire structure that is arranged between the panel surface and the chip's lower edge. A frame structure adapted to the coefficients of thermal expansion yields a component that has an elevated cycle resistance. Moreover, it is thereby possible to reduce the diameter of the bumps, which results in a reduction of the overall height of the component as a whole. This is possible since thermal strains have been compensated for by larger bump diameters, a larger overall height and a larger component surface to such an extent as to reduce the thermal stress inside the bumps, which have a certain elasticity.

On the example of a metallic frame structure, FIG. 8 shows the different process steps in the manufacturing of a component. The starting point is a panel PA, particularly a ceramic one, which is shown for simplicity without additional layers in the figure. First a base metallization GM of, for instance, titanium is applied over the entire extent of the surface of panel PA by, for instance, sputtering, CVD, PECVD, vapor deposition or some other thin film process. Subsequently, a photomask PM is applied for structuring purposes to the base metallization by, for instance, application of a photoresist layer over the entire surface and subsequent structuring. FIG. 8a shows the panel with the applied photomask PM.

Figure 8A:
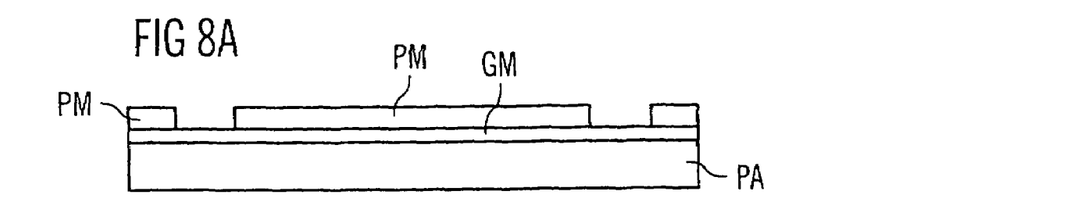
FIG. 8 shows various process steps in the manufacture of a component.
Figure 8B:
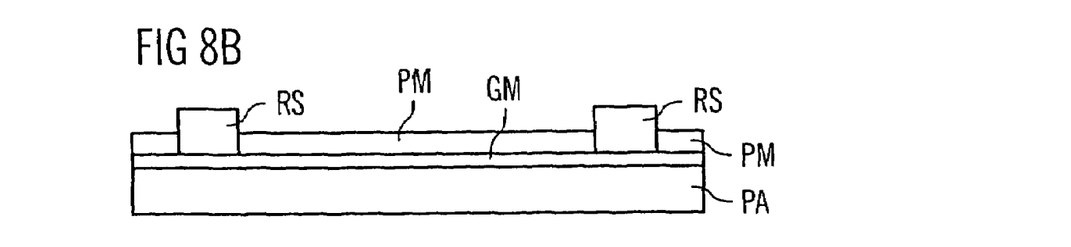

Then the frame structure is produced by reinforcing the base metallization in the areas left exposed by photomask PM. This can be done by currentless metallization or by a galvanic method. The frame structure can also be produced in several steps from different metals, because the individual layers can comprise copper or nickel for example. Other metals are also suitable in principle for producing a frame structure. Metallization is facilitated if the photomask includes a two layer resist wherein the lower layer of the resist system can be metallized currentlessly, but the upper layer cannot. This accelerates the deposition of metal on the areas of panel PA not covered by photomask PM. FIG. 8b shows the thus reinforced frame structure RS.

The photomask, as well as the exposed base metallization, is then removed. The photomask can be stripped or removed in a plasma, while the base metallization is removed by an etching step, usually a wet process.

Figure 8C:
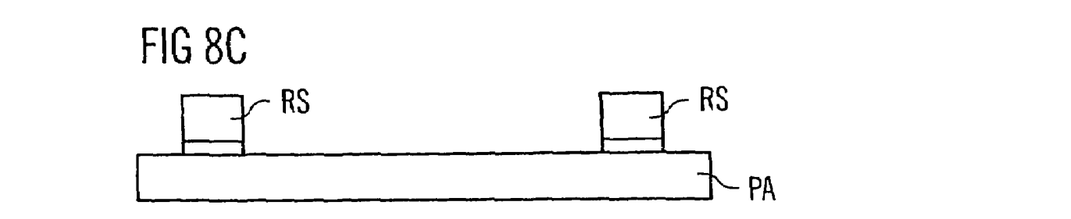

FIG. 8c shows the finished frame structure RS on panel PA. Contact surfaces on the surface of the panel that serve for electrical and mechanical connection of the chip are arranged inside the annularly closed frame structure. The component chip CH is correspondingly mounted on these contact surfaces via, for instance, bumps BU and permanently connected mechanically by, for instance, a reflow soldering process.

In the next step the surface energy of the arrangement is modified in order to minimize wetting with the later jet printed structure, or to allow it to happen only in desired areas. To adjust the surface energy, it is possible to reduce the overall surface energy by adjusting it to be hydrophobic. This can be accomplished by exposing the entire arrangement in a fluorine containing plasma. It is possible for this purpose to introduce $C_4F_8$ gas at a working pressure of 0.3 mbar into a plasma reactor in which the panel with the frame structure and the mounted or soldered chip is arranged. A plasma treatment for roughly 30 sec can be sufficient to adjust the surface energy to a value that is not further reducible.

Alternatively, the surface energy is successfully reduced by aqueous treatment with a silanization agent such as hexamethyl disilazane.

An alternative possibility for adjusting a suitable surface energy is to increase the surface energy in the area to be wetted. This can be done by structured treatment of the surface in the area of the seam, for example, by treatment with an adhesion promoter, which increases the adhesion of the jet printed structure in the treated surface area.

Now a jet printed structure is deposited with the assistance of a jet printing process in the area of the seam between the frame structure and the chip. A print head can be used here that has an array of, for instance, 100 to 500 nozzles of suitable cross section. Each nozzle is connected to a drivable device such as a piezo element for ejecting a drop. Such an element can be triggered at a high frequency. The volume of an individual ejected drop is then substantially dependent on the cross section of the nozzle and the viscosity of the liquid to be injected.

It is possible for a large area to be scanned at high velocity with such a moving print head, with which arbitrary types of structures can be produced by appropriate driving of the nozzles, while the minimum widths are dependent on the droplet size and on the edge angle on the printed surface. With a droplet of a given diameter, structural heights that amount to 20 to 50% of the original droplet diameter can be printed in a single pass. If the surface energy on the surface to be printed is set lower, then a higher structure can be successfully printed with the droplet than in the case of good wetting. It is additionally advantageous if the printing compound for the jet printed structure is adjusted to be thixotropic. This can by done by using suitable and conventionally known additives for the printing compound.

It is also possible to carry out the jet printing process at an angle deviating from 90°, so that the liquid droplets are ejected towards the panel surface at an angle of 45°, for example. This facilitates the sealing of the seam between the frame structure and the chip. It is also possible for the printing angle to be modified during printing as a function of the topography of the surface to be printed on.

The jet printed structure can be produced in two or more superimposed layers, wherein each layer that is produced experiences at least a partial curing or drying before application of the next layer. The curing of the jet printed structure can be accomplished by a combination of different curing methods that are dependent on the chemistry of the material to be printed.

Figure 8D:
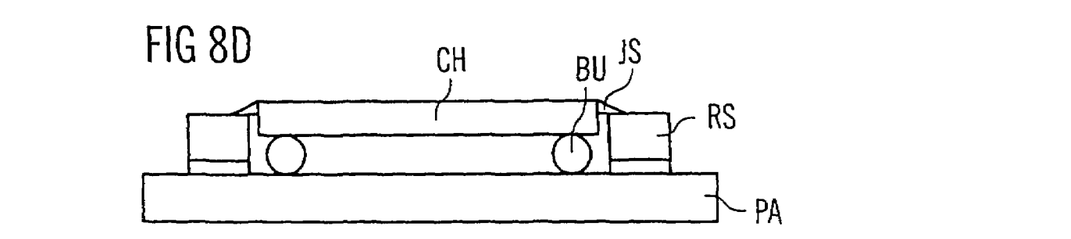

The hydrophobicization of the surface or the suitably adjusted surface energy prevents the polymer, applied as a liquid, from being drawn into the space under the chip by the capillary action of the seam. FIG. 8d shows the arrangement after production of the jet printed structure.

Figure 8E:
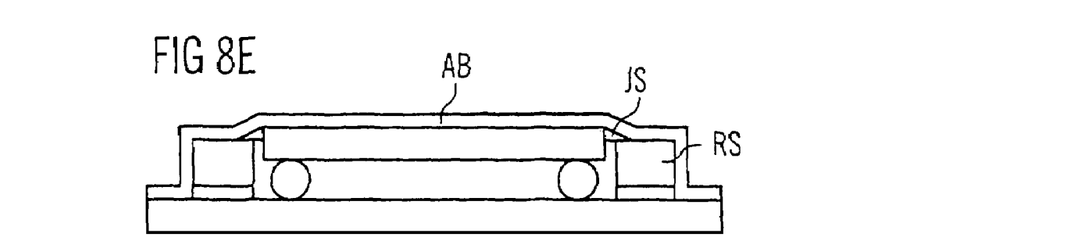

Since the jet printed structure JS is optimized for a minimal structural width and therefore a reduced volume, the hollow space under the chip is indeed tightly closed but not hermetically. Therefore an additional covering AB is advantageously produced over the entire arrangement.

This covering can be done in a simple manner by producing a full surface metallic layer. For this purpose, the surface is first adjusted to be hydrophilic again by, for example, treatment with an oxygen plasma. Similarly to the frame structure, the covering can again be done by a two step process with a vapor deposited or sputtered base metallization and a galvanic or currentless reinforcement of this base metallization.

It is also possible, however, to produce the covering from plastic and for instance apply it in droplets. It is also possible to laminate a cover film as a covering AB. This can be a plastic or multilayer film that may contain a metallic layer. It is also possible to metallize the plastic covering afterwards. The covering can also be applied by film casting. In order to produce a hermetic covering, it suffices to apply the covering to the back side of the chip as well to seal it to the lateral surface of the frame structure. It is also possible to seal the cover to the surface of the substrate.

By virtue of the structurally precisely applied jet printed structure, it becomes possible overall to reduce the space between the chip's lateral edges and the lateral edge of the panel, without the process thereby becoming more insecure or more imprecise. Thus a further reduction of size is achieved.

Figure 9A:
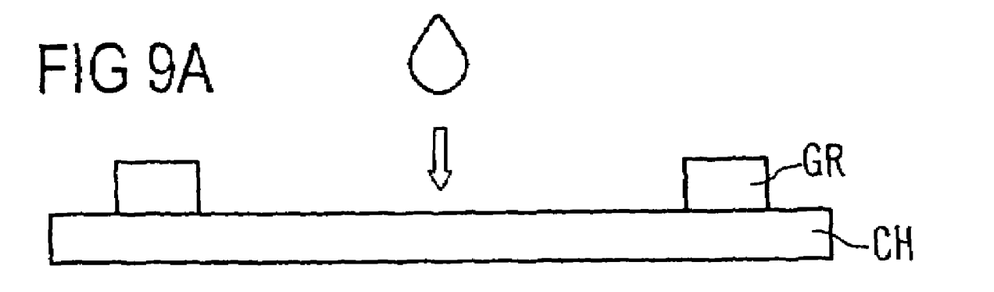
FIG. 9 shows two process steps in the manufacture of a large surface polymer layer by means of a molded frame.
Figure 9B:
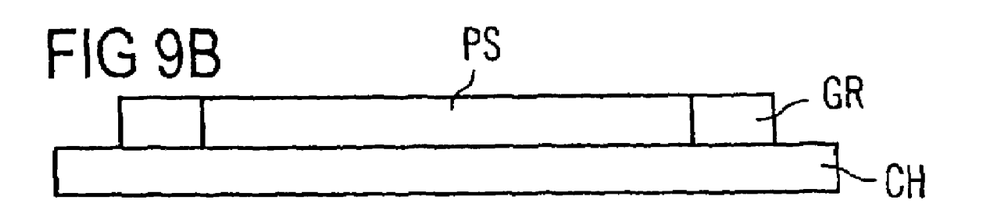

FIG. 9 shows a supplementary possibility for performing a large surface coating with the aid of a jet printed structure. For this purpose, a closed cast frame GR is first produced by means of a jet printing process on a substrate, for instance, on the surface of a panel PA or on the back side of the chip. The height of the cast frame is dimensioned to correspond to the desired height of a polymer layer to be applied. After curing of the cast frame a liquid polymer that can flow freely and completely fills out the space enclosed by the cast frame is dropped inside the cast frame. The cast frame can be used to limit a globtop seal above the chip on the panel spatially. The cast frame and the polymer layer PS applied therein can also be used to produce, solely on the chip surface or on a panel surface, a polymer layer to be applied in a defined or structured manner.

It is possible that panels, such as ceramic panels that have a certain warp after sintering may not have a completely flat surface due to manufacturing conditions. The frame structure is then advantageously planarized immediately after production so that its surface can form a flat mounting plane for the chip. For a multilayer frame structure, this planarization can also be done after production of a lower sub layer of the frame structure, presuming that the upper sub layer is applied as a receding step or in a method that is exact relative to the deposition height. The planarization can be done, for instance, by CMP (chemical mechanical polishing), milling, grinding or mechanical pressing. Alternatively, the surface of the panel itself can be planarized.

The invention was presented only on the basis of some examples, but is not limited thereto. In particular, the type of component, referred to here as a MEMS component for the sake of simplicity, can comprise all types of electro micromechanical and electrooptical elements that have a mechanically sensitive front side with component structures. The invention can be used with particular advantage for components operating with acoustic waves.

A MEMS component can be produced as a single component, but is preferably produced on a large surface panel that has a plurality of installation sites for individual chips. Different chips can also be mounted on the panel in one process and sealed by means of a jet printed structure and a cover. Different components can also form a module, it also being possible for several modules to be produced in parallel on one panel.

What is claimed is:

1. A method of manufacturing a micro-electro-mechanical systems (MEMS) component, the method comprising:
producing a plurality of frame structures on a panel, each of the plurality of frame structures for enclosing a chip installation site;
connecting, via bumps, a plurality of chips to the panel at installation sites, at least one of the plurality of chips having a back side containing active components; and
using a jet-printing process to apply a jet-printed structure that substantially closes a gap between the frame structure and the plurality of chips;
wherein a fluid and curable resin, a melted polymer, or a dispersion containing nanoparticles is used to produce the jet-printed structure.

2. A method of manufacturing a micro-electro-mechanical systems (MEMS) component, the method comprising:
producing a plurality of frame structures on a panel, each of the plurality of frame structures for enclosing a chip installation site;
connecting, via bumps, a plurality of chips to the panel at the installation site, at least one of the plurality of chips having a back side containing active components; and
using a jet-printing process to apply a jet-printed structure that substantially closes a gap between the frame structure and the plurality of chips;
wherein a fluid and curable resin is printed as a dispersion containing nanoparticles to produce the jet-printed structure.

3. The method of claim 1 or 2, further comprising:
separating the MEMs component from other MEMs components by cutting the panel.

4. The method according to claim 1, wherein the melted polymer comprises a UV-curing polymer.

5. The method of claim 1 or 2, further comprising:
before applying the jet-printed structure, modifying surface energy of surfaces coming into contact with the jet-printed structure such that the jet-printed structure does not wet the surfaces coming into contact with the jet-printed structure.

6. The method of claim 5, further comprising:
applying, to the surfaces coming into contact with the jet-printed structure, a film comprising a non-wetting surface, the film having a thickness of one or a more molecules.

7. The method of claim 6, further comprising
treating the surfaces coming into contact with the jet-printed structure with a plasma containing fluorine.

8. The method of claim 6, further comprising:
treating the surfaces coming into contact with the jet-printed structure with an organosilicon solution.

9. The method of claim 1 or 2, further comprising:
after connecting the plurality of chips and applying the jet-printed structure, applying a base metallization to the panel by sputtering, CVD, PECVD, vapor deposition, or a thin-film process; and
reinforcing the base metallization by depositing a metal layer using solution.

10. The method of claim 1 or 2, wherein the jet-printing process is performed under exposure to UV.

11. The method of claim 1 or 2, further comprising:
applying a cast frame to the panel, the cast frame being applied under UV exposure during the jet-printing process; and
producing a cover layer on the component by applying a polymer inside the cast frame without simultaneous UV exposure, wherein the polymer flows inside the cast frame and is thereafter cured.

12. The method of claim 1 or 2, further comprising:
applying a base metallization to the panel;
covering the base metallization with a polymer mask such than an annularly closed strip of the base metallization remains uncovered
reinforcing the base metallization in an area of the annular strip by metal deposition from a solution to thereby produce a metallic frame structure; and
removing the polymer mask prior to connecting a plurality of chips to the panel.

13. The method of claim 12, wherein the metallic frame structure has a height that is at least half a height of the bumps.

14. The method of claim 1 or 2, further comprising:
before connecting the plurality of chips, producing a frame structure on the panel, the frame structure comprising ceramic or metal and having a spacing away from a lower edge of at least one of the plurality of chips; and
sealing the frame structure via the jet-printing process after connecting the plurality of chips.

15. The method of claim 1 or 2, further comprising:
applying, to the panel, a base metallization comprising an adhesion layer comprising titanium and a copper layer; and
enhancing a thickness of the base metallization via non-current deposition using copper and nickel.

16. The method of claim 15, further comprising:
applying a lamination film before applying the base metallization; and
removing the lamination film in a strip-shaped area around at least one of the plurality of chips.

17. The method of claim 1 or 2, further comprising:
producing a polymer layer on a back side of at least one of the plurality of chips; and
depositing a metal layer over the polymer layer, the metal layer comprising a hermetic cover layer.

18. The method of claim 1 or 2, wherein polymer structures having a height between 20 μm and 30 μm height are produced in a single pass of the jet-printing process.

* * * * *